US005611940A

United States Patent [19]
Zettler

[11] Patent Number: 5,611,940
[45] Date of Patent: Mar. 18, 1997

[54] MICROSYSTEM WITH INTEGRATED CIRCUIT AND MICROMECHANICAL COMPONENT, AND PRODUCTION PROCESS

[75] Inventor: Thomas Zettler, München, Germany

[73] Assignee: Siemens Aktiengesellschaft, Munich, Germany

[21] Appl. No.: 431,499

[22] Filed: Apr. 28, 1995

[30] Foreign Application Priority Data

Apr. 28, 1994 [DE] Germany ................... 44 14 968.9

[51] Int. Cl.$^6$ ................................................. B44C 1/22
[52] U.S. Cl. ................................. 73/514.16; 156/656.1; 156/657.1; 216/2; 73/514.29; 437/927
[58] Field of Search ........................... 216/2, 41, 79, 216/99; 156/656.1, 657.1, 659.11; 437/927; 310/310, 323, 329; 73/517 R

[56] References Cited

U.S. PATENT DOCUMENTS 5,326,726   7/1994  Tsang et al. ................. 437/927 X

FOREIGN PATENT DOCUMENTS

87/07729  12/1987  WIPO .

OTHER PUBLICATIONS

Research News Science vol. 242 (Pool), 2 pages, "Microscopic Motor Is a First Step".
IEEE Publ. CH2957–Sep./91 (Guckel et al.), pp. 74–79, "Fabrication of Assembled Micromechanical Components...".
IOP Publ. 1991 (Mehregany et al.), pp. 73–85, "Surface micromachined mechanisms and micromotors".
IEEE Transducers 91 Publ. (Chen et al.), pp. 739–742, "A Selective CVD Tungsten Process for Micromotors".
Elsevier Science Publishers Microelectronic Eng. 13 (1991) 509–512 (Bley et al.), "Description of Micro...".
Elsevier Sequoia Publication 1992 (Tavrow et al.), pp. 33–43, "Operational characteristics of microfabricated".

*Primary Examiner*—William Powell
*Attorney, Agent, or Firm*—Herbert L. Lerner; Laurence A. Greenberg

[57] ABSTRACT

A microsystem on a semiconductor substrate includes an integrated circuit having an insulating layer, a contact in the insulating layer, a lower-lying circuit element, and a conductive layer being disposed above the insulating layer and being connected through the contact to the lower-lying circuit element. A micromechanical component has a fixed micromechanical structure, a movable micromechanical structure, a further contact, and is at least partially formed of the conductive layer. The insulating layer and/or the further contact connects the fixed micromechanical structure to the substrate. The insulating layer is absent under the movable micromechanical structure. A production process for the microsystem includes structuring the conductive layer for producing the fixed and movable micromechanical structures, while simultaneously structuring the conductive layer in the region of the integrated circuit; and exposing the movable micromechanical structure by removing the insulating layer located under the movable micromechanical structure in an etching process having adequate selectively for the conductive layer and having an isotropic component.

18 Claims, 3 Drawing Sheets

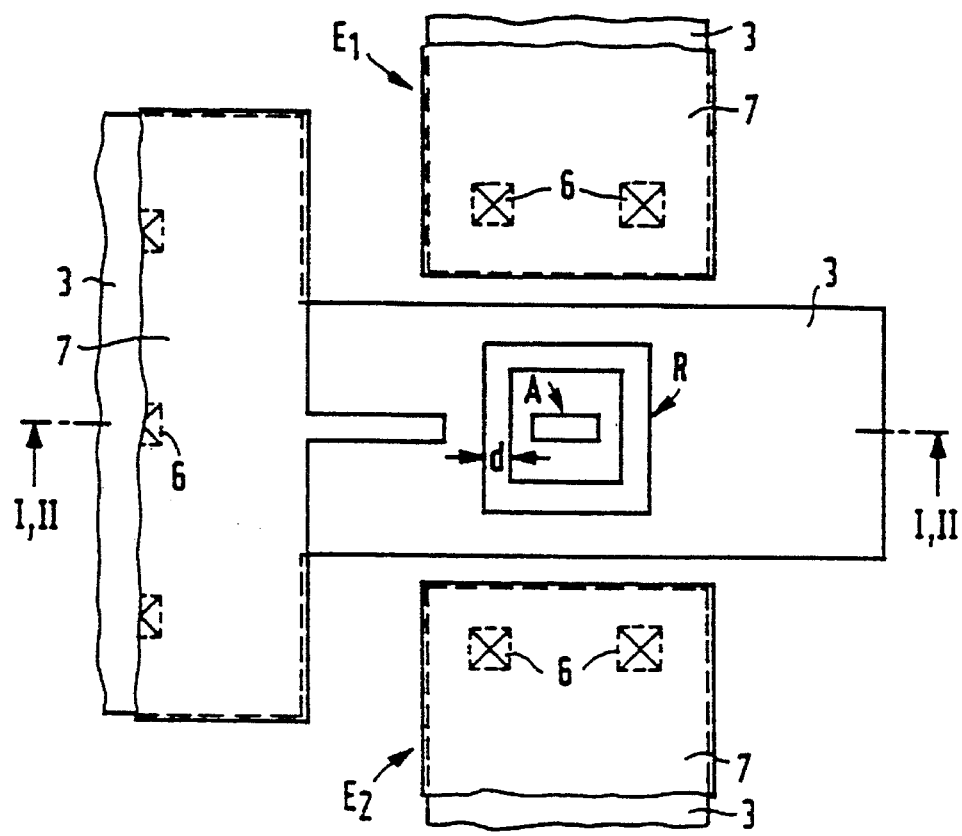
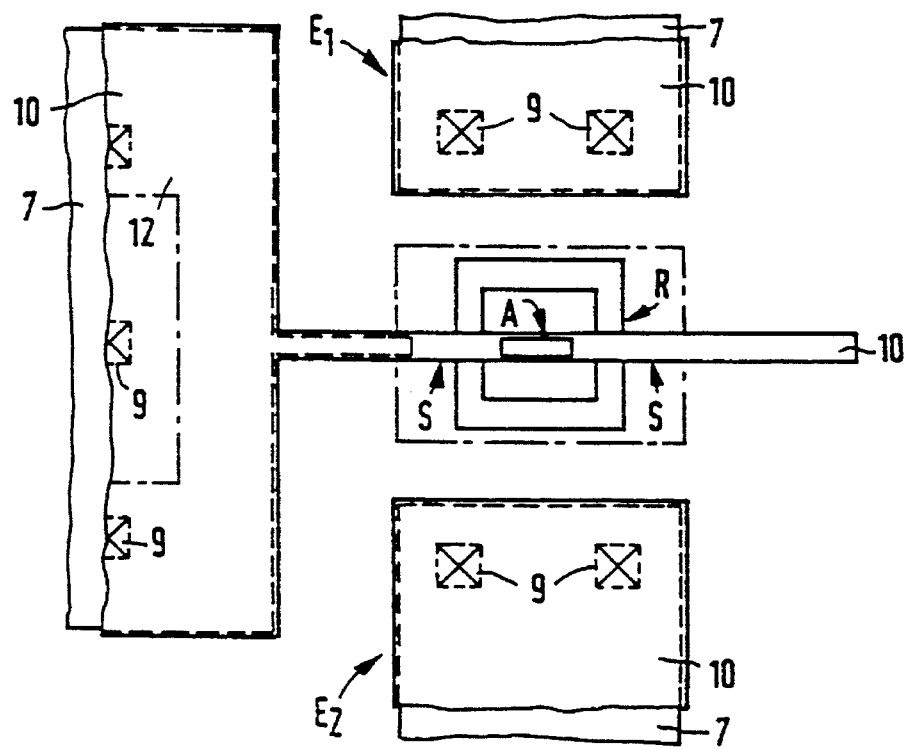

MICROSYSTEM WITH INTEGRATED CIRCUIT AND MICROMECHANICAL COMPONENT, AND PRODUCTION PROCESS

BACKGROUND OF THE INVENTION

Field of the Invention

The invention relates to a microsystem being disposed on a semiconductor substrate and having an integrated circuit and a micromechanical component. The invention also relates to a process for producing the microsystem.

In the production of micromechanical components, for instance for the use of actors and sensors, there is great interest in processes that are compatible with the manufacture of integrated circuits, especially on a silicon substrate. Integrating micromechanics and trigger or evaluation circuits in microsystems is possible only if there is compatibility of the production processes. That is also important whenever existing semiconductor production systems are to be used to produce micromechanical structures as well. A process with which both an integrated circuit and a micromechanical component can be produced simultaneously in different regions of the semiconductor substrate, or in other words with which a microsystem can be produced without additional process effort, or with only minimal additional effort, besides that for the integrated circuit, would be especially advantageous.

In the case of microsystems, micromechanical components having a function which is based on electrostatic forces, especially between capacitor surfaces with variable spacing, are of primary interest, since then a suitable combination of conductive and non-conductive layers which are used in integrated circuits as well is fundamentally adequate. Such micromechanical components include fixed and movable micromechanical structures. A typical example of an application is a motor (with a pivot shaft and a stator as a fixed micromechanical structure and a rotor as a movable micromechanical structure), a gear, or a proportional or non-proportional force sensor.

For micromechanical components, the following production processes are known among others:

a) Polysilicon Center Pin and Flange Process (M. Mehrengany, Y. C. Tai, J. Micromech. Microeng., Vol. 1, 73, 1991):

In order to produce the micromechanical structures following the production of the integrated circuit, such a process requires additional depositions of polysilicon after the metallizing complex. If the center pin process is to be performed before the integrated circuit is metallized, then the problem arises of etching the movable structures until they are exposed, i.e., laid bare, and simultaneously of protecting the insulation of the metallizing. Another disadvantage is the relatively high specific resistance of doped polysilicon.

b) Polysilicon-LOCOS Process (L. S. Tavrow et al, Sensors and Actuators A, Phys., Vol. A35, 33, 1992):

That process provides for making the movable micromechanical structures on a flat LOCOS oxide layer. Due to the temperature stress, the oxidation step can be performed only prior to the production of the transistors of an integrated circuit. If the entire process is carried out before the integrated circuit is produced, the resultant topology is unfavorable for the later steps, and the problem arises of protecting the micromechanical structures during the production of the integrated circuit. In an intertwined production process of that kind, the problem of etching the rotor in such a way that it is freely exposed while simultaneously protecting the circuit insulation oxides must be solved.

c) Selective Tungsten Process (L. Y. Chen et al, TRANSDUCERS '91, Int. Conf. on Solid-State Sensors and Actuators, San Francisco, Calif., IEEE Cat. No. 91CH2817-5, 739, 1991):

That process can be carried out following a circuit production process, but the proposed method does not solve the problems of electrical contacting and of protecting the metallizing insulation. The process is especially complicated and quite expensive because of the lithography steps.

d) LIGA Process (P. Bley et al, Microelectronic Engineering 13, 509, 1991; H. Guckel et al, Conf. Proceedings IEEE Micro Electro Mechanical Systems, Nara, Japan, 1991):

That process requires X-ray lithography and possibly later mounting of loose microscopic components.

None of those processes are configured in terms of their conception for the joint and in particular simultaneous production of an integrated circuit and the micromechanical component in a microsystem. They require a great number of layers and process steps, which serve solely to produce the micromechanical component, and are superfluous or even constricting or disadvantageous for the production of an integrated circuit.

SUMMARY OF THE INVENTION

It is accordingly an object of the invention to provide a microsystem with an integrated circuit (IC) and a micromechanical component, as well as a process for its production, which overcome the hereinafore-mentioned disadvantages of the heretofore-known devices and methods of this general type, in which no additional process effort and expense is necessary to produce the micromechanical component from the time of the IC production, and in which the production process permits the integrated circuit and the micromechanical component of the microsystem to be produced simultaneously.

With the foregoing and other objects in view there is provided, in accordance with the invention, a microsystem on a semiconductor substrate, comprising an integrated circuit having an insulating layer, a contact in the insulating layer, a lower-lying circuit element, and a conductive layer being disposed above the insulating layer and being connected through the contact to the lower-lying circuit element; a micromechanical component having a fixed micromechanical structure, a movable micromechanical structure, a further contact, and being at least partially formed of the conductive layer; at least one of the insulating layer and the further contact connecting the fixed micromechanical structure to a semiconductor substrate; and the insulating layer being absent under the movable micromechanical structure.

With the objects of the invention in view, there is also provided a production process for a microsystem including an integrated circuit having an insulating layer and a conductive layer on the insulating layer; and a micromechanical component having a fixed micromechanical structure and a movable micromechanical structure, which comprises structuring the conductive layer for producing the fixed and movable micromechanical structures, while simultaneously structuring the conductive layer in the region of the integrated circuit; and exposing the movable micromechanical structure by removing the insulating layer located under the movable micromechanical structure in an etching process having adequate selectively for the conductive layer and having an isotropic component.

The invention is based on using layers that are required anyway for the integrated circuit as parts of the micromechanical component. The layers need merely be structured according to a suitable construction, in such a way that the structures required for the intended function are formed in the micromechanical component. The integrated circuit can be made by any desired technology (such as CMOS, bipolar, BICMOS).

Since the micromechanical component is generally also intended to take on an electrical function, conductive structures are employed for its fixed and movable micromechanical structures. In particular, these structures are made up entirely or in part of a metallizing layer, which is used in the region of the integrated circuit for the wiring of various circuit elements. The integrated circuit may have a single-layer or multiple-layer wiring (that is, one or more metallizing planes), of which one, several or all can be used for the micromechanical component.

The conductive layer is applied at least in the region of the integrated circuit on an insulating layer, which is typically referred to as an intermediate oxide, and mechanically joined by way of it to lower-lying structures (generally referred to as a substrate). The electrical contact to the lower-lying circuit elements is made through contacts in the insulating layer. Through a simultaneously made contact, an electrical and/or mechanical connection with the substrate can be achieved in the region of the micromechanical component. For instance a motor shaft or an electrode can be connected as a fixed micromechanical component to the substrate.

In the region of the micromechanical component, the insulating layer can remain under a fixed micromechanical structure as a connection, or can be removed. In the surroundings of a movable structure, the insulating layer is removed entirely. This is performed by an etching process that has adequate selectivity for the conductive layer (that is, for the material of the movable structure) and that has an isotropic component, in order to underetch the movable structure entirely. The etching process is carried out by using a mask, which has an adequately large opening above the movable micromechanical structure to assure the necessary exposure of the movable structure, as a function of the isotropy of the etching process and of the region to be underetched. In the region of the integrated circuit, the connection pads of the circuit are exposed by the etching process.

In the case of a freely movable micromechanical structure, after the etching process, the micromechanical structure no longer has any connection with the remainder of the component. In the case of a resiliently movable micromechanical structure, a connection is still present, preferably through a portion of the conductive layer of small cross-sectional area extended outward to the side, which on its other side is connected to a securing plate, for instance, and acts as a spring element between the movable structure and the securing plate.

The micromechanical component is accordingly created without additional effort beyond the production process for the integrated circuit: Both the conductive and the insulating layers and the etching processes are already necessary for the integrated circuit. Only the masks need be suitably adapted in the region of the micromechanical component.

Other features which are considered as characteristic for the invention are set forth in the appended claims.

Although the invention is illustrated and described herein as embodied in a microsystem with an integrated circuit and a micromechanical component, as well as a production process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3 and 4 are fragmentary plan views of the micromechanical component of FIGS. 1 and 2 after structuring of respective first and second metallizing planes.

DESCRIPTION OF THE PREFERRED EMBODIMENTS

Figure 1:
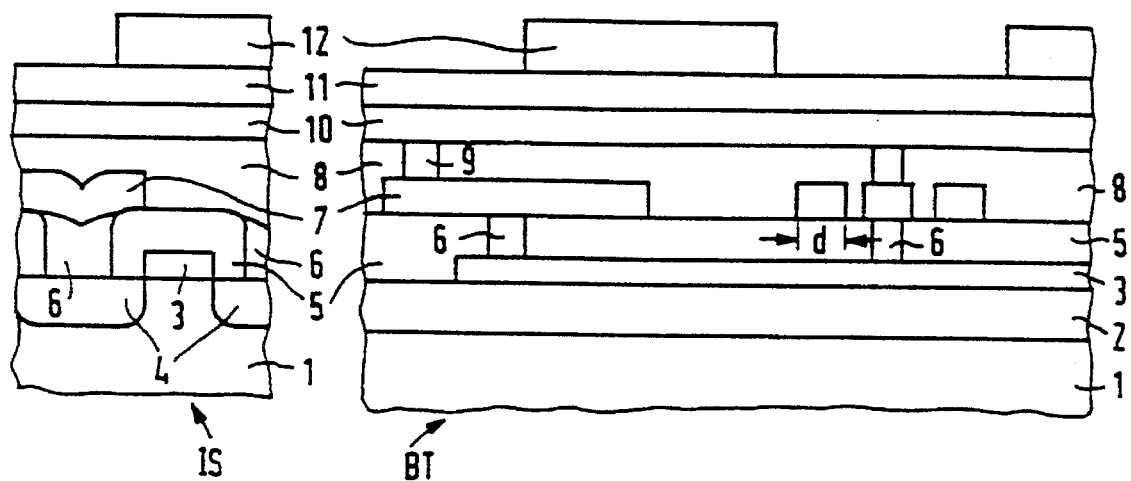
FIGS. 1 and 2 are fragmentary, diagrammatic, cross-sectional views of a semiconductor substrate, each showing an integrated circuit (region IS) and a micromechanical component (region BT), in terms of which the method is illustrated.
Figure 2:
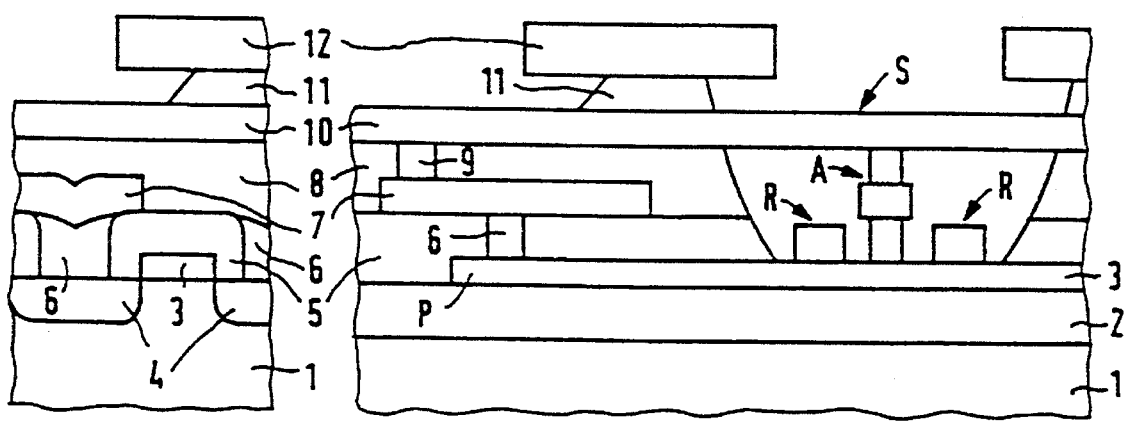

Referring now to the figures of the drawing in detail and first, particularly, to FIGS. 1–4 thereof, there is seen a first exemplary embodiment of the invention, in conjunction with which a micromechanical component that can be used as a micromotor will be described. It has a shaft A and electrodes $E_1$, $E_2$ seen in FIGS. 2 and 4 as fixed micromechanical components and a ring R as a movable micromechanical component. In FIGS. 1 and 2, the electrodes $E_1$, $E_2$ are respectively located in front of and behind the plane of the drawing.

In FIG. 1, a silicon semiconductor substrate 1 with a field oxide 2 is shown. Other process steps which are necessary for producing an integrated circuit (IC) are also performed. In the case of a CMOS circuit, these produce epitaxial layers, doped wells, channel implantation, and gate oxide, for instance. A polysilicon layer 3 is deposited and structured for a gate plane of the IC. In the region of a micromechanical component (BT region), this region is structured as is shown in FIG. 3. In other words, underneath the later movable structure it remains and serves there, among other purposes, as an etch stop and above a portion P it serves as an electrical terminal. In front of and behind the plane of the drawing of FIGS. 1 and 2, separate polysilicon surfaces are formed, which will later be connected to the electrodes $E_1$, $E_2$ of the motor.

In an IC region IS, a gate 3 is formed and, among other steps, an implantation of source/drain zones 4 is performed.

In a preferably planar intermediate oxide 5 which is provided on the polysilicon layer 3 as an insulating layer, contacts 6 to the polysilicon layer or to lower-lying layers are present at predetermined points. In the region BT, one such contact forms part of the shaft A and one or more of the contacts can be disposed on the polysilicon electrodes. The portion P of the polysilicon layer 3 shown in FIGS. 1 and 2 is also connected toward the top through such a contact 6.

The gate layer or the S/D zones 4 can be connected in the region IS.

A first metal layer 7, which is formed of AlSi, for instance, and is suitably structured, is located as a conductive layer on the intermediate oxide 5. In the region BT, the metal electrodes $E_1$, $E_2$ of FIGS. 3 and 4 are structured, they are preferably approximately congruent with the polysilicon electrodes and they are connected to them through the contacts 6. A portion of the shaft A of the first metallizing layer is formed as a further fixed micromechanical structure. Likewise, a (later) movable micromechanical structure is formed, for instance in the form of a self-contained path (the ring R) around the shaft and without any connection with it. Since the ring is later to be entirely exposed by underetching, it has a relatively slight path width d.

In the region IS, the first metallizing layer 7 can act, for instance, as a connection of S/D zones of transistors, or simultaneously as a conductor filling of the contacts 6 as well.

The first metallizing layer 7 is covered with a preferably planar intermetallic dielectric 8 which, for example, is made of suitable oxide. Contacts 9, which are known as vias, are disposed in the dielectric 8 at predetermined points. In the region BT, one or more of the vias 9 in turn form a portion of the shaft A and optionally of the electrodes $E_1$, $E_2$. In the region IS, the first metallizing layer is connected through the vias 9.

A second metallizing layer 10 which, for instance, is formed of AlSi, is located on the intermetallic dielectric 8. The metallizing layer 10 is structured in such a way that in the region BT it represents a security device S for preventing the movable structures, which are to be later exposed, from falling out. The security device S does so, for example, by forming a closed hoop with the aid of the underlying layers, or forming a surface on the shaft that has a larger diameter than the corresponding inside diameter of the ring 7. The polysilicon layer 3 can also be connected to the outside, as is shown in FIG. 2, through the second metallizing layer 10, the via 9, the first metallizing layer 7, the contact 6, and the lateral portion P. The drawings also show a direct connection of the shaft A through the second metallization 10.

In the region IS, various circuit elements are wired by the first and/or second metallizing layer 7, 10. In particular, connecting lines between the micromechanical component and an evaluation or trigger circuit, made in the IC region, are also formed from the metallizing layer or layers.

The entire configuration is covered with a passivation layer 11 which, for example, is formed of plasma oxide and plasma nitride. A mask 12 having an opening in the region BT is applied above the movable structure to be exposed, above the connection pad for the polysilicon layer 3 and in the IC region IS above the pads to be connected from the outset. Then the insulating layers 5, 8, 11 are etched. In this operation, the following conditions must be taken into account:

the etching process must be sufficiently selective for the conductive layers 6, 7, 9, 10, and in this example for the polysilicon 3 as well; and the isotropic component of the etching process and the size of the opening in the mask must be chosen, while taking the individual layer thicknesses into account, in such a way that the ring of widths d (and in this case the security device S as well) are completely underetched. In this example, the edges of the electrodes seen in FIGS. 3 and 4 are also to be exposed by the etching process. In the IC region, the etching must stop at the metal-2 pad. In FIG. 4, the edges of the photoresist mask 12 are shown in dashed lines.

The etching process is preferably carried out in the form of wet etching with a buffered HF solution, or in the form of microwave-supported dry etching.

The processes known from IC manufacture can be employed for the individual steps of the production process. For instance, the production of the metal layers can also be performed simultaneously with the filling up of the contacts or vias, in such a way that after etching of the contact holes (or through holes), an adhesive layer (for instance 40 nm Ti+100 nm TiN) is deposited in the corresponding insulation layer. Then in a CVD process, tungsten is applied, both to fill the contact holes and simultaneously to act as metallizing layers.

The component can be used as a microactuator or as a linear micromotor. To that end, the ring R and the shaft A shown in FIG. 1 above the polysilicon layer 3 are connected to ground, in such a way that the laterally outward-extending portion P of the polysilicon layer 3 and of the conductive layers located over it are connected to a ground potential through the connection pad 10, or else the shaft A is connected directly to ground through the pad 10. The electrodes $E_1$, $E_2$ shown in FIGS. 3 and 4 are connected in alternation to ground and to a positive voltage. The ring R is moved in alternation to the proper electrode by means of the electrostatic field that changes at the same rate. In order to overcome sliding friction, voltages of approximately 50 V to 100 V are necessary, given a gap of 3µ between the ring and the electrode. In order to insulate such voltages adequately, the entire structure is preferably built up on field oxide, as is shown in FIGS. 1 and 2. Since the electrodes include the conductive layers 3, 7, 10 that are stacked one above the other and connected to one another, a highly homogeneous field is generated. A linear motor of this kind was made with the following structural measurements (as seen in a plan view):

Shaft: 8µ×1.6µ

Ring: inside diameter 9.8µ×3.4µ, outer diameter 11.8µ× 5.4µ

Spacing between outer ring edge and electrode edges: 2µ

Could be run at 90 V.

The component can also be used as a gravitation or acceleration sensor. The ring R is spaced apart by a large or small distance from the electrodes seen in FIGS. 3, 4, as a function of an acceleration that has occurred, or of the spatial orientation of the substrate. This change in spacing can be detected capacitively. It is advantageous, but not necessary, to expose the edges of the electrodes $E_1$, $E_2$ by etching in the isotropic etching process. The requisite measuring circuit can be made on the same substrate without additional effort.

The component can also be used as a switch, if the electrodes $E_1$, $E_2$ at the edges are exposed by etching and if the ring R is dimensioned in such a way that it can touch the electrodes $E_1$, $E_2$. Depending on the location of the ring, an electrical contact between one or more electrode layers and the polysilicon layer 3 located under the ring is closed.

The component can be used universally as a non-proportional force sensor (event sensor). For instance, the positional change of the ring to be detected (capacitively or in the form of a short circuit) can also be brought about by the force of flowing media or by direct mechanical influence.

As a second example, a micromechanical component that can be used as a proportional force sensor is described with reference to FIGS. 5–7. The micromechanical component includes:

a ground element M, which is formed of a conductive layer of the IC wiring and is suspended in resilient fashion;

a spring element F, which is connected on one side to the ground element and on the other to a securing plate;

a securing plate B, which is connected to the substrate and the spring element; and an electrode E, which forms a capacitor with the ground elements.

Preferably, these structures are all formed of the same conductive layer. However, in the case of certain tasks it may also be advantageous to make the ground element and the electrode, for instance, of different conductive layers. The securing plate and the electrode are fixed micromechanical components. The ground element and the spring element (at least over an adequate portion thereof) are movable micromechanical structures. The securing plate preferably performs the task both of mechanically connecting the spring element to the substrate and of forming an electrical connection with an evaluation circuit by means of a line L. The electrode E is also connected to the evaluation circuit through a line L.

The component can be made by the process described in conjunction with the first example. It can also be employed in a microsystem with an inlay metallization. In that case, in the region BT, it has the order of layers shown in FIGS. 5 and 6 (the reference numerals correspond to those of FIGS. 1 and 2 and the IC region IS is not shown). The substrate 1, for which a number of process steps have already generally been performed for the integrated circuit, can have an arbitrary layer, such as field oxide or polysilicon, on its surface. Located over that layer is the intermediate oxide 5 as the insulating layer and the metallizing layer 7 as a conductive layer. The metallizing layer is structured, as is shown in FIG. 7, to make the ground element M, the spring element F, the securing plate B, the electrode E and the lines L to the evaluation electronics. The securing plate B may also be omitted, and the spring element can merge directly with the lines. The metallizing layer 7 is covered with the passivation layer 11.

Figure 6:
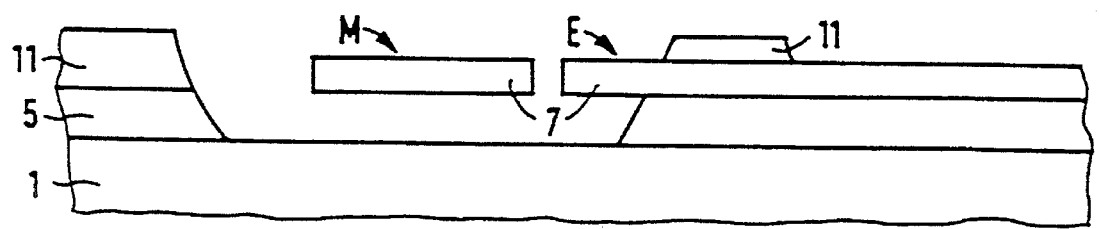

The photoresist mask 12 for the isotropic etching process has a large enough opening to ensure that, as already explained, at least the ground element M and a sufficiently large portion of the spring element F for the spring action are underetched, as is seen in FIG. 6. At least the edge of the electrode E should be exposed as well. The securing plate B is not exposed by etching or underetched, in order to assure a reliable mechanical fastening to the substrate 1 through the insulating layer 5. The photoresist mask 12 can have a further opening above the electrode E as shown. The opening is dimensioned in such a way that the etching process stops at the electrode. The electrode can then be contacted directly from above. In the non-illustrated IC region, the photoresist mask has openings of the metallizing pads, which are to be connected from outside. Once the mask 12 is removed, the microsystem is finished by the usual IC process.

In the case of a multilayer wiring, the movable and fixed structures can, for instance, all be formed of the topmost wiring layer. Alternatively, they may be formed of different layers, or the lines L may be made from a higher wiring layer than the other structures.

If a force acts upon the ground element M, then the spring F bends, and the ground element changes its location. The change in location can be detected in the form of a change in capacitance between the ground element and the electrode. As a result of the restoring force of the spring, the capacitance signal varies monotonally with the incident force. The component can therefore be used as an acceleration sensor, by exploiting the force of inertia on the ground element. However, it is equally possible to detect other force effects upon the ground element. For instance, the force of a flowing liquid or gas, or the direct action of the force of an external mechanical component can be detected. The ground and the electrode can also be disposed one above the other, with the bending of the spring taking place in the corresponding direction.

The component can also be used as a switch, if the edge of the electrode E is exposed. The exertion of force on the ground element is evidenced by the fact that a short circuit takes place between the electrode (or a plurality of electrodes) and the ground element. The short circuit occurs if the incident force is greater than or equal to the restoring force of the spring at maximum deflection (impact).

Figure 5:
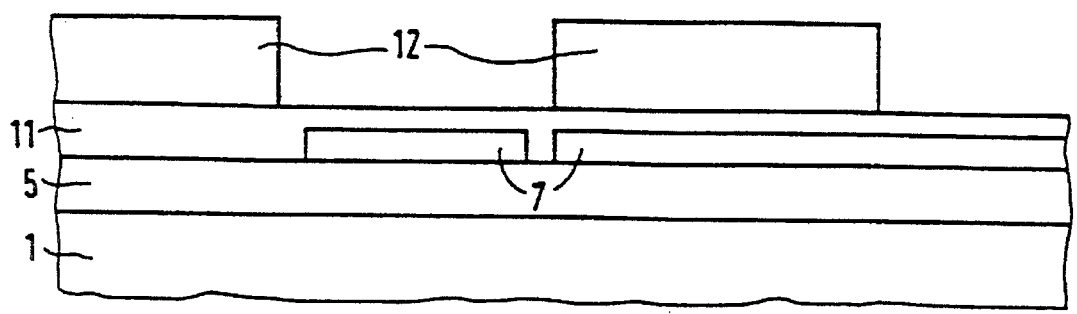
FIGS. 5 and 6 are fragmentary cross-sectional views and FIG. 7 is a plan view of a respective micromechanical component, in accordance with a further embodiment of the invention.
Figure 7:
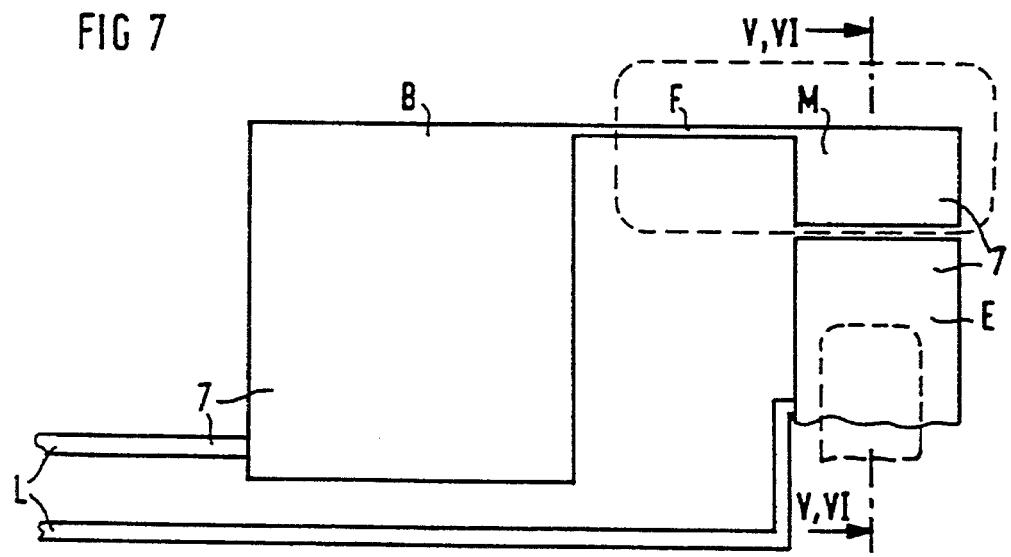

The component shown in FIGS. 5 and 7 can also be used as an actuator. To that end, voltages are applied on one hand to the ground element M, the spring element F, and the securing plate B, and on the other hand to the electrode. The electrostatic field caused by a voltage difference between the ground element and the electrode exerts a force upon the ground element and thus causes bending of the spring element and displacement of the ground element.

In addition to a quasi-static operating mode, a dynamic operating mode is possible, in which the applied voltage is an alternating voltage and the ground element is caused to execute mechanical oscillations (oscillator function). Since the mechanical oscillation amplitudes become maximal upon excitation with the natural frequency of the spring/ground system and lead to an extreme value in the alternating current resistance, the component can be used as a frequency-determining element in an electronic circuit (resonator function).

The outlines of the component shown in FIGS. 5–7 represent only one exemplary embodiment. Other shapes are equally possible. For instance, the edges of the electrode and the ground element which face one another could be constructed in comb-like fashion to increase the surface area.

I claim:

1. A microsystem on a semiconductor substrate, comprising:

an integrated circuit having an insulating layer, a contact in said insulating layer, a lower-lying circuit element, and a conductive layer being disposed above said insulating layer and being connected through said contact to said lower-lying circuit element;

a micromechanical component having a fixed micromechanical structure, a movable micromechanical structure, and being at least partially formed of said conductive layer;

said fixed micromechanical structure being connected to a semiconductor substrate; and said insulating layer being absent under said movable micromechanical structure.

2. The microsystem according to claim 1, wherein said movable micromechanical structure is freely movable.

3. The microsystem according to claim 1, wherein said movable micromechanical structure is resiliently movable.

4. The microsystem according to claim 1, wherein said integrated circuit has a plurality of conductive layers in the form of a multilayer metallization, and said micromechanical structures are formed of a plurality of metallizing layers.

5. The microsystem according to claim 1, wherein said integrated circuit has an at least single layer metallization with said conductive layer, and all of said micromechanical structures are formed of said conductive layer.

6. The microsystem according to claim 2, including a security device for preventing said freely movable micromechanical structure from falling out, said security device being formed from a different metallizing layer than said movable structure.

7. The microsystem according to claim 1, wherein said integrated circuit has a plurality of conductive layers, at least one of said conductive layers is formed of an aluminum alloy, and said insulating layer is formed of a silicon oxide.

8. The microsystem according to claim 1, wherein said integrated circuit has a plurality of conductive layers, at least one of said conductive layers is formed substantially of tungsten, and said insulating layer is formed of a silicon oxide.

9. The microsystem according to claim 1, wherein said micromechanical component is selected from the group consisting of a proportional force sensor, a non-proportional force sensor, an oscillator, and a resonator.

10. The microsystem according to claim 1, wherein said micromechanical component is selected from the group consisting of a micromotor and a microactuator.

11. The microsystem according to claim 1, wherein said integrated circuit includes a trigger or evaluation circuit for said micromechanical component and a plurality of conductive layers, and including a line being made from at least one of said conductive layers for connecting said trigger or evaluation circuit to said component.

12. A production process for a microsystem including an integrated circuit having an insulating layer and a conductive layer on the insulating layer; and a micromechanical component having a fixed micromechanical structure and a movable micromechanical structure, which comprises:

structuring the conductive layer for producing the fixed and movable micromechanical structures, while simultaneously structuring the conductive layer in the region of the integrated circuit; and exposing the movable micromechanical structure by removing the insulating layer located under the movable micromechanical structure in an etching process having adequate selectively for the conductive layer and having an isotropic component.

13. The production process according to claim 12, which comprises carrying out the etching step as a microwave-supported isotropic dry etching.

14. The production process according to claim 12, which comprises carrying out the etching step with a buffered HF solution.

15. The production process according to claim 12, which comprises producing the integrated circuit and the micromechanical component with a plurality of conductive layers, covering the conductive layers with further insulating layers, and etching the insulating layers in the etching step with adequate selectively for the conductive layers.

16. The microsystem according to claim 1, wherein said micromechanical component includes a further contact which connects said fixed micromechanical structure to the semiconductor substrate.

17. The microsystem according to claim 16, wherein said insulating layer and said further contact connect said fixed micromechanical structure to the semiconductor substrate.

18. The microsystem according to claim 1, wherein said insulating layer connects said fixed micromechanical structure to the semiconductor substrate.

* * * * *